(12) United States Patent
Schmatz

(10) Patent No.: US 12,514,807 B2
(45) Date of Patent: Jan. 6, 2026

(54) CELLULOSE NANOCRYSTAL EFFECT PIGMENTS FOR COSMETIC APPLICATIONS

(71) Applicant: SUN CHEMICAL COLORS & EFFECTS GMBH, Ludwigshafen am Rhein (DE)

(72) Inventor: Brian Joseph Schmatz, Florham Park, NJ (US)

(73) Assignee: SUN CHEMICAL B.V., Weesp (NL)

(*) Notice: Subject to any disclaimer, the term of this patent is extended or adjusted under 35 U.S.C. 154(b) by 835 days.

(21) Appl. No.: 17/783,945

(22) PCT Filed: Dec. 11, 2020

(86) PCT No.: PCT/EP2020/085683
§ 371 (c)(1),
(2) Date: Jun. 9, 2022

(87) PCT Pub. No.: WO2021/116367
PCT Pub. Date: Jun. 17, 2021

(65) Prior Publication Data
US 2023/0052291 A1    Feb. 16, 2023

Related U.S. Application Data

(60) Provisional application No. 62/947,323, filed on Dec. 12, 2019.

(51) Int. Cl.
*A61K 8/73* (2006.01)
*A61K 8/02* (2006.01)
*A61Q 1/06* (2006.01)
*A61Q 1/10* (2006.01)
B82Y 30/00 (2011.01)

(52) U.S. Cl.
CPC ............ *A61K 8/731* (2013.01); *A61K 8/0254* (2013.01); *A61Q 1/06* (2013.01); *A61Q 1/10* (2013.01); *A61K 2800/436* (2013.01); *B82Y 30/00* (2013.01)

(58) Field of Classification Search
None
See application file for complete search history.

(56) References Cited

U.S. PATENT DOCUMENTS

| 5,629,055 | A | 5/1997 | Revol et al. |
| 2019/0002700 | A1 | 1/2019 | Andrews et al. |
| 2019/0330378 | A1 | 10/2019 | Zhang et al. |
| 2020/0239698 | A1* | 7/2020 | Wosylus ............... A61K 8/0254 |
| 2020/0330356 | A1* | 10/2020 | Guariloff ............... A61Q 19/08 |

FOREIGN PATENT DOCUMENTS

| CN | 102449052 A | 5/2012 |
| JP | 2009-209217 A | 9/2009 |
| JP | 2017-048181 A | 3/2017 |
| JP | 2018-512109 A | 5/2018 |
| JP | 2019-070084 A | 5/2019 |
| WO | 2011/088552 A1 | 7/2011 |
| WO | 2012/112541 A2 | 8/2012 |
| WO | 2014118466 A1 | 8/2014 |
| WO | 2018/100065 A1 | 6/2018 |

OTHER PUBLICATIONS

EPO, Communication pursuant to Rule 114(2) EPC, Observations by a Third Party, issued for the corresponding European Patent Application No. 20839230.8, dated Jul. 13, 2023, 14 pages.
Malvern Instruments Limited, "A Basic Guide to Particle Characterization," Inform White Paper, 2012, 26 pages.
Reproduction of Examples from EP 20839230.8, 2 pages.
ISA/EP, "PCT International Search Report and Written Opinion", issued in connection with corresponding PCT Application No. PCT/EP2020/085683, which was mailed on Apr. 26, 2021, 11 pages.
ISA/EP, "PCT International Preliminary Report on Patentability", issued in connection with corresponding PCT Application No. PCT/EP2020/085683, which was mailed on Jun. 23, 2022, 9 pages.
Prashant Chauhan; et al., "A nanocellulose-dye conjugate for multiformatoptical pH-sensing", Chemical Communications, vol. 50, 2014, p. 9493-9496.

* cited by examiner

*Primary Examiner* — Danah Al-Awadi
(74) *Attorney, Agent, or Firm* — Lucas & Mercanti, LLP

(57) ABSTRACT

The present invention relates to a cosmetic composition including an organic effect pigment. The organic effect pigment includes cellulose nanocrystal flakes which have an average size in the range of from 10 to 6500 micrometers.

8 Claims, 8 Drawing Sheets a.

b.

a.

b.

a.

b.

CELLULOSE NANOCRYSTAL EFFECT PIGMENTS FOR COSMETIC APPLICATIONS

CROSS-REFERENCE TO RELATED APPLICATIONS

This application is a 371 of PCT/EP2020/085683, filed Dec. 11, 2020, which claims the benefit of U.S. Provisional Patent Application No. 62/947,323, Filed Dec. 12, 2019.

The present invention relates to a cosmetic composition comprising an organic effect pigment, a process for preparing a cosmetic composition comprising an organic effect pigment, a use of the organic effect pigment and a kit for preparing two cosmetic compositions comprising the organic effect pigment.

Effect pigments, also known as pearlescent pigments or nacreous pigments, are used to impart a pearlescent luster, metallic luster, and/or multi-color effect approaching iridescence, to a material. For example, fluorphlogopite mica pigment, mica based ferric ferrocyanide pigment and borosilicate flakes are used in cosmetics. Other pigments such as colored polyethylene terephthalate (PET) glitter are also used in cosmetics.

In the cosmetic market, there is a need for colorants that are based on renewable sources, such as cellulose, and are ultimately biodegradable. For example, there is a need to replace PET glitters which have come under scrutiny for their persistence in the environment. Further, in view of the new regulations, providing pigments free of heavy metals and $TiO_2$ are also of great interest.

Cellulose nanocrystals (CNCs) are obtained through renewable cellulose sources. They are acid-treated cellulose fibers. These nanocrystals are used in the cosmetic field as fillers or thickeners as described for example in WO 2018/100065 A1 and JP 2017/048181 A.

Further, US 2019/0002700 A1 discloses cellulose-based organic pigments which might be used for cosmetic applications. However, it is completely silent regarding any structural color element and uses cellulose nanocrystals powder only with dye to color a composition and the color will depend only on the used dye.

WO 2012/112541 A2 discloses a pigment composition comprising two effect pigments, wherein the hue of the composition is comparable to carmine. Said pigment composition may be incorporated into cosmetic compositions. However, said pigment composition permits to obtain only one color/hue in the cosmetic compositions.

Therefore, it was an object of the present invention to provide a cosmetic composition comprising an effect pigment having a color variability while being based on renewable sources and biodegradable and a method for preparing such cosmetic composition.

Therefore, the present invention relates to a cosmetic composition comprising an organic effect pigment, wherein the organic effect pigment comprises cellulose nanocrystal flakes, wherein the cellulose nanocrystal flakes have an average size in the range of from 10 to 6500 micrometers, determined as defined in Reference Example 1a.

It is preferred that the organic effect pigment consists of the cellulose nanocrystal flakes. Therefore, the present invention preferably relates to a cosmetic composition comprising an organic effect pigment, wherein the organic effect pigment consists of cellulose nanocrystal flakes, wherein the cellulose nanocrystal flakes have an average size in the range of from 10 to 6500 micrometers, determined as defined in Reference Example 1a.

In the context of the present invention, it is preferred that the cellulose nanocrystal flakes have an average size in the range of from 50 to 2000 micrometers, more preferably in the range of from 200 to 900 micrometers, more preferably in the range of from 400 to 800 micrometers, determined as defined in Reference Example 1a.

It is preferred that the cellulose nanocrystal flakes have an average surface area in the range of from 1 to 200 $mm^2$, more preferably in the range of from 5 to 175 $mm^2$, more preferably in the range of from 10 to 150 $mm^2$, determined as described in Reference Example 1 b.

It is preferred that the cellulose nanocrystal flakes have an average thickness in the range of from 30 to 200 micrometers, more preferably in the range of from 40 to 150 micrometers, more preferably in the range of from 50 to 100 micrometers, determined as described in Reference Example 1c.

It is preferred that the cellulose nanocrystal flakes exhibit a circular shape or a hexagonal shape.

It is preferred that the cellulose nanocrystal flakes are iridescent.

It is preferred that the cosmetic composition comprises the organic effect pigment in an amount in the range of from 0.025 to 99 weight-%, more preferably in the range of from 0.04 to 80 weight-%, more preferably in the range of from 0.05 to 30 weight-%, more preferably in the range of from 0.10 to 20 weight-%, more preferably in the range of from 0.5 to 15 weight-%, more preferably in the range of from 1 to 10 weight-%, more preferably in the range of from 2 to 8 weight-%, based on the total weight of the cosmetic composition. It is more preferred that the cosmetic composition comprises the organic effect pigment in an amount in the range of from 3 to 7 weight-% based on the total weight of the cosmetic composition.

Therefore, the present invention preferably relates to a cosmetic composition comprising an organic effect pigment, wherein the organic effect pigment comprises, more preferably consists of, cellulose nanocrystal flakes, wherein the cellulose nanocrystal flakes have an average size in the range of from 10 to 6500 micrometers, more preferably in the range of from 50 to 2000 micrometers, determined as defined in Reference Example 1a, wherein the cosmetic composition comprises the organic effect pigment in an amount in the range of from 0.025 to 99 weight %, more preferably in the range of from 0.04 to 80 weight-%, more preferably in the range of from 0.05 to 30 weight-%, more preferably in the range of from 0.10 to 20 weight-%, more preferably in the range of from 0.5 to 15 weight-%, more preferably in the range of from 1 to 10 weight-%, more preferably in the range of from 2 to 8 weight-%, more preferably in the range of from 3 to 7 weight-%, based on the total weight of the cosmetic composition.

In the context of the present invention, it is preferred that the cosmetic composition further comprises a liquid phase, wherein the cellulose nanocrystal flakes form a mixture with said liquid phase, wherein the liquid phase more preferably contains a cosmetically acceptable liquid medium.

It is preferred that at a temperature of the composition in the range of from 5 to 70° C., more preferably in the range of from 10 to 60° C., more preferably in the range of from 15 to 50° C., from 99 to 100 weight-%, more preferably from 99.5 to 100 weight-%, more preferably from 99.9 to 100 weight-%, of the cellulose nanocrystal flakes are dispersed in the cosmetically acceptable liquid medium.

It is preferred that, in the cosmetic composition, the color of the cellulose nanocrystal flakes in the visible spectrum depends on the dielectric constant of the liquid phase.

It is preferred that the liquid phase is an aqueous phase or an anhydrous phase.

As to the aqueous phase, it is preferred that it comprises water in amount in the range of from 40 to 99 weight-%, more preferably in the range of from 50 to 98.5 weight-%, more preferably in the range of from 60 to 98 weight-%, based on the total weight of the liquid phase.

Therefore, the present invention preferably relates to a cosmetic composition comprising an organic effect pigment, wherein the organic effect pigment comprises, more preferably consists of, cellulose nanocrystal flakes, wherein the cellulose nanocrystal flakes have an average size in the range of from 10 to 6500 micrometers, more preferably in the range of from 50 to 2000 micrometers, determined as defined in Reference Example 1a, wherein the cosmetic composition further comprises a liquid phase, wherein the cellulose nanocrystal flakes form a mixture with said liquid phase, wherein the liquid phase more preferably contains a cosmetically acceptable liquid medium, wherein the liquid phase is an aqueous phase comprising water in amount in the range of from 40 to 99 weight-%, more preferably in the range of from 50 to 98.5 weight-%, more preferably in the range of from 60 to 98 weight-%, based on the total weight of the liquid phase. It is noted that the dielectric constant of the aqueous phase is different to the dielectric constant of the anhydrous phase. Thus, depending on the liquid phase and thus its dielectric constant, the color of the cellulose nanocrystal flakes in the cosmetic composition will vary in the visible spectrum.

In the context of the present invention, as to the anhydrous phase, it is preferred that it comprises an oil in amount in the range of from 40 to 90 weight-%, more preferably in the range of from 45 to 89.5 weight-%, more preferably in the range of from 50 to 89 weight-%, based on the total weight of the liquid phase.

It is preferred that the oil comprised in the anhydrous phase is one or more of a mineral oil, an animal oil, a vegetal oil and a synthetic oil, more preferably one or more of a vegetal oil, a mineral oil and a synthetic oil, more preferably one or more of a synthetic oil and a mineral oil, more preferably a synthetic oil.

Therefore, the present invention preferably relates to a cosmetic composition comprising an organic effect pigment, wherein the organic effect pigment comprises, more preferably consists of, cellulose nanocrystal flakes, wherein the cellulose nanocrystal flakes have an average size in the range of from 10 to 6500 micrometers, more preferably in the range of from 50 to 2000 micrometers, determined as defined in Reference Example 1a,
  wherein the cosmetic composition further comprises a liquid phase, wherein the cellulose nanocrystal flakes form a mixture with said liquid phase, wherein the liquid phase more preferably contains a cosmetically acceptable liquid medium, wherein the liquid phase is an anhydrous phase comprising an oil in amount in the range of from 40 to 90 weight-%, more preferably in the range of from 45 to 89.5 weight-%, more preferably in the range of from 50 to 89 weight-%, based on the total weight of the liquid phase,
  wherein the oil more preferably is one or more of a mineral oil, an animal oil, a vegetal oil and a synthetic oil, more preferably one or more of a vegetal oil, a mineral oil and a synthetic oil, more preferably one or more of a synthetic oil and a mineral oil, more preferably a synthetic oil.

In the context of the present invention, it is preferred that the cosmetic composition further comprises at least one additional cosmetically acceptable component other than the organic effect pigment. It is preferred that said cosmetically acceptable component is one or more of a surfactant, an oil other than the oil defined in the foregoing, a cosmetically active ingredient, a preservative, a chelating agent, a neutralizing agent, a rheological agent, an excipient, an emulsifier, a fragrance, a thickener, a polymer, a gel former, a photoprotective agent, an antioxidant, an antifoams, a resin, a stabilizer, a sterilizing agent, a propellant, a drying agent, an humectant, an antioxidant and a plant extract. It is more preferred that said cosmetically acceptable component is one or more of a surfactant, an oil other than the oil defined in the foregoing, a cosmetically active ingredient, a preservative, a chelating agent, a neutralizing agent, a rheological agent, an excipient, an emulsifier, and a fragrance. It is more preferred that said cosmetically acceptable component is one or more of a surfactant, an oil other than the oil defined in the foregoing, a cosmetically active ingredient, a preservative, a chelating agent, a neutralizing agent, and a rheological agent.

It is preferred that the cosmetic composition further comprises at least one additional cosmetically acceptable component other than the organic effect pigment, wherein said at least one cosmetically acceptable component is dissolved in the liquid medium, the at least one cosmetically acceptable component forming the liquid phase with the liquid medium, wherein the at least one additional cosmetically acceptable component other than the organic effect pigment more preferably is as defined in the foregoing.

It is preferred that the cosmetic composition is in the form of a cream, an emulsion, a foam, a gel, a lotion, a milk, a mousse, an ointment, a paste, a spray, or a suspension.

It is preferred that from 0 to 0.001 weight-%, more preferably from 0 to 0.0001 weight-%, more preferably from 0 to 0.00001 weight-%, of the cosmetic composition consist of an effect pigment other than the organic effect pigment defined in the foregoing.

It is preferred that from 0 to 0.001 weight-%, more preferably from 0 to 0.0001 weight-%, more preferably from 0 to 0.00001 weight-%, of the cosmetic composition consist of a polyelectrolyte.

It is preferred that the cellulose nanocrystal flakes are not coated with one or more inorganic oxides. Indeed, it is not necessary for the cellulose nanocrystal flakes to be coated with any inorganic oxides in order to present different colors, preferably absorption colors, in a cosmetic composition.

It is preferred that the cellulose nanocrystal flakes are obtained or obtainable by a process comprising (i) and (ii) as defined in the following.

Further, the present invention relates to a process for preparing a cosmetic composition, preferably the cosmetic composition according to the present invention and as defined above, the process comprising
  (i) providing an aqueous dispersion comprising water and cellulose nanocrystals;
  (ii) subjecting the aqueous suspension provided according to (i) to drying conditions, obtaining a film; and fragmenting said film into flakes, obtaining an organic effect pigment;
  (iii) preparing a mixture comprising the organic effect pigment obtained from (ii) and a liquid phase, and optionally at least one additional cosmetically acceptable component other than the organic effect pigment obtained from (ii), obtaining the cosmetic composition.

(i)

It is preferred that, in the aqueous dispersion provided according to (i), the cellulose nanocrystals are comprised in an amount in the range of from 0.05 to 10 weight-%, more preferably in the range of from 0.1 to 8 weight-%, more preferably in the range of from 0.5 to 6 weight-%, more preferably in the range of from 0.75 to 5 weight-%, more preferably in the range of from 1 to 4 weight-%, based on the total weight of the aqueous dispersion.

It is preferred that the cellulose nanocrystals in the aqueous dispersion provided according to (i) are sodium cellulose nanocrystals sulfate, wherein the sulfur content is of less than 1 weight %, more preferably less than 0.9 weight-%, based on the weight of the cellulose nanocrystals.

It is preferred that the aqueous dispersion provided according to (i) is an acidic aqueous dispersion, wherein the aqueous phase of the dispersion has a pH in the range of from 0 to 5, more preferably in the range of from 1 to 4, more preferably in the range of from 2 to 3. The pH preferably is determined as described in Reference Example 1d.

It is preferred that the aqueous dispersion provided according to (i) additionally comprises an acid, wherein the acid more preferably is one or more of a hydrochloric acid, a sulfonic acid, a nitric acid and a citric acid, more preferably one or more of a hydrochloric acid, a nitric acid and a citric acid, more preferably one or more of a hydrochloric acid and a citric acid, more preferably a hydrochloric acid.

It is preferred that the water comprised in the aqueous dispersion provided according to (i) is deionized water.

It is preferred that the cellulose nanocrystals comprised in the aqueous suspension provided according to (i) have an average particle size in the range of from 1 to 50 micrometers. The average particle size preferably is determined as described in Reference Example 1e.

It is preferred that the cellulose nanocrystals comprised in the aqueous suspension provided according to (i) are hydrolyzed cellulose nanocrystals.

It is preferred that the cellulose nanocrystals comprised in the aqueous suspension provided according to (i) exhibit a crystallite average particle diameter in the range of from 1 to 10 nm, more preferably in the range of from 1.5 to 6 nm, more preferably in the range of from 2 to 5 nm, determined as described in Reference Example 1f.

It is preferred that the cellulose nanocrystals comprised in the aqueous suspension provided according to (i) exhibit a crystallite average particle length in the range of from 20 to 200 nm, more preferably in the range of from 30 to 150 nm, more preferably in the range of from 40 to 110 nm, determined as described in Reference Example 1f.

It is preferred that the cellulose nanocrystals comprised in the aqueous suspension provided according to (i) exhibit a crystallinity in the range of from 70 to 100%, more preferably in the range of from 85 to 100%, determined as described in Reference Example 1g.

It is preferred that the cellulose nanocrystals comprised in the aqueous suspension according to (i) have a BET specific surface area in the range of from 150 to 700 $m^2/g$, more preferably in the range of from 200 to 600 $m^2/g$, more preferably in the range of from 300 to 500 $m^2/g$. The BET specific surface area preferably is determined as described in Reference Example 1h.

It is preferred that the cellulose nanocrystals comprised in the aqueous suspension provided according to (i) are obtainable or obtained by a method comprising
(a) isolating cellulose from a natural source of cellulose, more preferably from wood or cotton;
(b) hydrolyzing with an acid, more preferably sulfuric acid, the isolated cellulose obtained in (a), obtaining the cellulose nanocrystals.

It is preferred that the process of the present invention further comprises preparing the cellulose nanocrystals according to (i), said preparing comprising
(a) isolating cellulose from a natural source of cellulose, more preferably from wood or cotton;
(b) hydrolyzing with an acid, more preferably sulfuric acid, the isolated cellulose obtained in (a), obtaining the cellulose nanocrystals.

It is preferred that the aqueous dispersion provided according to (i) additionally comprises a cosmetically acceptable dye, more preferably a cosmetically acceptable water-soluble dye at a temperature in the range of from 10 to 50° C., more preferably in the range of from 15 to 30° C.

It is preferred that the cosmetically acceptable dye is selected from the group consisting of a blue dye, a black dye, a red dye, a green dye, a yellow dye, a violet dye, an orange dye and a brown dye.

It is preferred that the cosmetically acceptable dye is present in the aqueous dispersion provided according to (i) in an amount in the range of from 0.0005 to 0.1 weight-%, more preferably in the range of from 0.001 to 0.05 weight-%, more preferably in the range of from 0.001 to 0.01 weight-%, based on the weight of the aqueous dispersion provided according to (i).

It is preferred that the aqueous dispersion provided according to (i) additionally comprises a salt, wherein the salt is one or more of sodium chloride (NaCl), potassium chloride (KCl), sodium iodide (NaI), potassium iodide (KI), ammonium chloride ($NH_4Cl$) and sodium sulfate ($Na_2SO_4$). It is preferred that, in the aqueous dispersion provided according to (i), the mass ratio of salt relative to water, m(salt):m(water), is in the range of from 0.00001:1 to 0.1:1, more preferably in the range of from 0.0001:1 to 0.01:1, more preferably in the range of from 0.0001:1 to 0.001:1.

It is preferred that the process comprises preparing the aqueous dispersion and subjecting the dispersion, prior to (ii), to sonication.

It is preferred that from 99 to 100 weight-%, more preferably from 99.5 to 100 weight-%, more preferably from 99.9 to 100 weight-% of the aqueous dispersion provided according to (i) consist of water, the cellulose nanocrystals, more preferably the hydrolyzed cellulose nanocrystals, more preferably an acid as defined in the foregoing, and optionally one or more of a cosmetically acceptable absorption dye as defined in the foregoing and a salt as defined in in the foregoing.

It is preferred that from 0 to 0.01 weight-%, more preferably from 0 to 0.001 weight-%, more preferably from 0 to 0.0001 weight-%, of the aqueous dispersion provided according to (i) consist of a polyelectrolyte.

(ii)

It is preferred that subjecting the aqueous suspension provided according to (i) to drying conditions according to (ii) comprises
pouring the aqueous dispersion provided according to (i), into a container;
drying the aqueous dispersion into the container, obtaining a film.

It is preferred that drying the aqueous dispersion is performed in a gas atmosphere having a temperature in the range of from 15 to 30° C., more preferably in the range of from 18 to 25° C., more preferably for a duration in the range of from 10 to 30 hours, wherein the gas atmosphere more preferably comprises one or more of oxygen and nitrogen, wherein the gas atmosphere more preferably comprises nitrogen or more preferably is air. Alternatively, it is preferred that drying the aqueous dispersion is performed in a gas atmosphere having a temperature in the range of from 40 to 90° C., more preferably in the range of from 65 to 85° C., more preferably for a duration in the range of from 2 to 8 hours, more preferably in the range of from 3 to 7 hours, wherein the gas atmosphere more preferably comprises oxygen, wherein the gas atmosphere more preferably comprises one or more of oxygen and nitrogen, wherein the gas atmosphere more preferably comprises nitrogen or more preferably is air.

It is preferred that the film obtained in (ii) is an iridescent film.

It is preferred that the film obtained in (ii) has an average thickness in the range of from 30 to 200 micrometers, more preferably in the range of from 50 to 100 micrometers, determined as described in Reference Example 1c.

It is preferred that the film has a water content in the range of from 0.1 to 5 weight-%, more preferably in the range of from 0.1 to 1 weight-%, based on the total weight of the film.

It is preferred that fragmenting said film into flakes according to (ii) is performed until the average size of the flakes is in the range of from 10 to 6500 micrometers, more preferably in the range of from 50 to 2000 micrometers, more preferably in the range of from 200 to 1000 micrometers, more preferably in the range of from 400 to 800 micrometers, determined as defined in Reference Example 1a.

It is preferred that, after fragmenting said film into flakes according to (ii), (ii) further comprises screening the obtained flakes.

(iii)

It is preferred that the organic effect pigment comprised in the mixture prepared according to (iii) is present in amount in the range of from 0.025 to 99 weight-%, more preferably in the range of from 0.04 to 80 weight-%, more preferably in the range of from 0.05 to 30 weight-%, more preferably in the range of from 0.10 to 20 weight-%, more preferably in the range of from 0.5 to 15 weight-%, more preferably in the range of from 1 to 10 weight-%, more preferably in the range of from 2 to 8 weight-%, more preferably in the range of from 3 to 7 weight-%, based on the total weight of the mixture.

It is preferred that the liquid phase in the mixture prepared according to (iii) contains a cosmetically acceptable liquid medium.

It is preferred that the liquid phase in the mixture prepared according to (iii) has a dielectric constant in the range of from 1 to 100, more preferably in the range of from 2 to 80, more preferably determined as described in Reference Example 1i.

It is preferred that the liquid phase in the mixture prepared in (iii) is an aqueous phase or an anhydrous phase.

As to the aqueous phase, it is preferred that it comprises water in amount in the range of from 50 to 99 weight-%, preferably in the range of from 60 to 99 weight-%, based on the total weight of the liquid phase.

It is preferred that the aqueous phase has a pH in the range of from 4 to 10, more preferably in the range of from 6 to 8. The pH preferably is determined as described in Reference Example 1d.

As to the anhydrous phase, it is preferred that it comprises an oil in amount in the range of from 40 to 90 weight-%, more preferably in the range of from 59 to 80 weight-%, based on the total weight of the liquid phase.

It is preferred that the anhydrous phase comprises an oil being one or more of a mineral oil, an animal oil, a vegetal oil and a synthetic oil, more preferably one or more of a mineral oil, a vegetal oil and a synthetic oil, more preferably a synthetic oil.

It is preferred that the mixture prepared in (iii) further comprises at least one additional cosmetically acceptable component other than the organic effect pigment.

It is preferred that the at least one additional cosmetically acceptable component is one or more of a surfactant, an oil other than the oil defined in the foregoing, a cosmetically active ingredient, a preservative, a chelating agent, a neutralizing agent, a rheological agent, an excipient, an emulsifier, a fragrance, a thickener, a polymer, a gel former, a photoprotective agent, an antioxidant, an antifoams, a resin, a stabilizer, a sterilizing agent, a propellant, a drying agent, an humectant, an antioxidant and a plant extract. It is more preferred that said cosmetically acceptable component is one or more of a surfactant, an oil other than the oil defined in the foregoing, a cosmetically active ingredient, a preservative, a chelating agent, a neutralizing agent, a rheological agent, an excipient, an emulsifier, and a fragrance. It is more preferred that said cosmetically acceptable component is one or more of a surfactant, an oil other than the oil defined in the foregoing, a cosmetically active ingredient, a preservative, a chelating agent, a neutralizing agent, and a rheological agent.

It is preferred that the mixture prepared in (iii) further comprises at least one additional cosmetically acceptable component other than the organic effect pigment, wherein said component is dissolved in the liquid medium, said at least one additional cosmetically acceptable component forming the liquid phase with the cosmetically acceptable liquid medium. It is more preferred that the at least one additional cosmetically acceptable component other than the organic effect pigment is the at least one additional cosmetically acceptable component as defined in the foregoing and that the liquid phase is as defined in the foregoing.

It is preferred that preparing a mixture comprising the organic effect pigment obtained from (ii), and the liquid phase, according to (iii) comprises mixing the organic effect pigment and the liquid phase at a temperature in the range of from 15 to 30° C., more preferably in the range of from 18 to 25° C.

It is more preferred that the process of the present invention consists of (i), (ii) and (iii).

The present invention further relates to a method for preparing two or more cosmetic compositions, said cosmetic compositions comprising the same organic effect pigment, which comprises, preferably consists of, cellulose nanocrystal flakes, as coloring agent and having different flake colors in the visible range, the method comprising adjusting the dielectric constant of the liquid phase of said cosmetic compositions, wherein the organic effect pigment more preferably is obtainable or obtained by a process comprising (i) and (ii) as defined in the foregoing. Adjusting the dielectric constant of the liquid phase of said cosmetic compositions preferably is to be understood as adjusting the dielectric constant of the liquid phase of a first cosmetic composition and adjusting the dielectric constant of the liquid phase of a second cosmetic composition such that the dielectric constant of the liquid phase of the first cosmetic composition is not equal to the dielectric constant of the liquid phase of the second cosmetic composition; or is to be understood as adjusting the dielectric constant of the liquid phase of a first cosmetic composition such that the dielectric constant of the liquid phase of the first cosmetic composition is not equal to the dielectric constant of the liquid phase of a second cosmetic composition.

It is preferred that each of the cosmetic compositions is in the form of a cream, an emulsion, a foam, a gel, a lotion, a milk, a mousse, an ointment, a paste, a spray or a suspension.

The present invention further relates to a use of an organic effect pigment, comprising, preferably consisting of, cellulose nanocrystal flakes, as coloring agent for preparing two or more cosmetic compositions, preferably cosmetic compositions in the form of a cream, an emulsion, a foam, a gel, a lotion, a milk, a mousse, an ointment, a paste, a spray or a suspension, said two or more compositions having different flake colors in the visible range, wherein the organic effect pigment is obtainable or obtained by a process comprising (i) and (ii) as defined in the foregoing.

It is preferred that the liquid phases of the two or more cosmetic compositions exhibit different dielectric constants. The dielectric constants preferably are determined as described in Reference Example 1i.

It is preferred that a first cosmetic composition has cellulose nanocrystal flakes having a green absorption color with blue iridescence and a second cosmetic composition has cellulose nanocrystal flakes having blue, red, pink, black or grey absorption color with blue iridescence.

The present invention further relates to a use of a cosmetic composition according to the present invention and as defined in the foregoing as a lip balm, an eyeshadow, a nail polish, a mascara, an eyeliner or a lipstick.

Finally, the present invention further relates to a kit for preparing two cosmetic compositions having different flake colors in the visible range, comprising:
(1) one organic effect pigment, wherein the organic effect pigment comprises, preferably consists of, cellulose nanocrystal flakes, wherein the cellulose nanocrystal flakes have an average size in the range of from 10 to 6500 micrometers determined as defined in Reference Example 1a, wherein the organic effect pigment preferably is as defined in the foregoing;
(2) a first cosmetic composition; and
(3) a second cosmetic composition other than the first cosmetic composition.

It is preferred that the first cosmetic composition comprises a first liquid phase and that the second cosmetic composition comprises a second liquid phase, wherein the first liquid phase and the second liquid phase exhibit different dielectric constants, more preferably determined as described in Reference Example 1i. In the context of the present invention, this is to be understood such that the first liquid phase may have a dielectric constant of about 2 and the second liquid phase may have a dielectric constant of about 50. Indeed, this would permit to obtain a first cosmetic composition having cellulose nanocrystal flakes of a certain color and a second cosmetic composition having cellulose nanocrystal flakes of a color other than the color of the cellulose nanocrystal flakes of the first cosmetic composition.

The present invention is illustrated by the following set of embodiments and combinations of embodiments resulting from the dependencies and back-references as indicated. In particular, it is noted that in each instance where a range of embodiments is mentioned, for example in the context of a term such as "The cosmetic composition of any one of embodiments 1 to 4", every embodiment in this range is meant to be explicitly disclosed for the skilled person, i.e. the wording of this term is to be understood by the skilled person as being synonymous to "The cosmetic composition of any one of embodiments 1, 2, 3 and 4". Further, it is explicitly noted that the following set of embodiments is not the set of claims determining the extent of protection, but represents a suitably structured part of the description directed to general and preferred aspects of the present invention.

1. A cosmetic composition comprising an organic effect pigment, wherein the organic effect pigment comprises cellulose nanocrystal flakes, wherein the cellulose nanocrystal flakes have an average size in the range of from 10 to 6500 micrometers, determined as defined in Reference Example 1a.

2. The cosmetic composition of embodiment 1, wherein the organic effect pigment consists of the cellulose nanocrystal flakes.

3. The cosmetic composition of embodiment 1 or 2, wherein the cellulose nanocrystal flakes have an average size in the range of from 50 to 2000 micrometers, preferably in the range of from 200 to 900 micrometers, more preferably in the range of from 400 to 800 micrometers, determined as defined in Reference Example 1a.

4. The cosmetic composition of any one of embodiments 1 to 3, wherein the cellulose nanocrystal flakes have an average surface area in the range of from 1 to 200 $mm^2$, preferably in the range of from 5 to 175 $mm^2$, more preferably in the range of from 10 to 150 $mm^2$, determined as described in Reference Example 1 b.

5. The cosmetic composition of any one of embodiments 1 to 4, wherein the cellulose nanocrystal flakes have an average thickness in the range of from 30 to 200 micrometers, preferably in the range of from 40 to 150 micrometers, more preferably in the range of from 50 to 100 micrometers, determined as described in Reference Example 1c.

6. The cosmetic composition of any one of embodiments 1 to 5, wherein the cellulose nanocrystal flakes exhibit a circular shape or a hexagonal shape.

7. The cosmetic composition of any one of embodiments 1 to 6, wherein the cellulose nanocrystal flakes are iridescent.

8. The cosmetic composition of any one of embodiments 1 to 7, comprising the organic effect pigment in an amount in the range of from 0.025 to 99 weight-%, preferably in the range of from 0.04 to 80 weight-%, more preferably in the range of from 0.05 to 30 weight %, more preferably in the range of from 0.10 to 20 weight-%, more preferably in the range of from 0.5 to 15 weight-%, more preferably in the range of from 1 to 10 weight-%, more preferably in the range of from 2 to 8 weight-%, more preferably in the range of from 3 to 7 weight-%, based on the total weight of the cosmetic composition.

9. The cosmetic composition of any one of embodiments 1 to 8, further comprising a liquid phase, wherein the cellulose nanocrystal flakes form a mixture with said liquid phase, wherein the liquid phase preferably contains a cosmetically acceptable liquid medium.

10. The cosmetic composition of embodiment 9, wherein at a temperature of the composition in the range of from 5 to 70° C., preferably in the range of from 10 to 60° C., more preferably in the range of from 15 to 50° C., from 99 to 100 weight-%, preferably from 99.5 to 100 weight-%, more preferably from 99.9 to 100 weight-%, of the cellulose nanocrystal flakes are dispersed in the cosmetically acceptable liquid medium.

11. The cosmetic composition of embodiment 9 or 10, wherein in the cosmetic composition, the color of the cellulose nanocrystal flakes in the visible spectrum depends on the dielectric constant of the liquid phase.

12. The cosmetic composition of any one of embodiments 9 to 11, wherein the liquid phase is an aqueous phase or an anhydrous phase.

13. The cosmetic composition of embodiment 12, wherein the aqueous phase comprises water in amount in the range of from 40 to 99 weight-%, preferably in the range of from 50 to 98.5 weight-%, more preferably in the range of from 60 to 98 weight-%, based on the total weight of the liquid phase.

14. The cosmetic composition of embodiment 12, wherein the anhydrous phase comprises an oil in amount in the range of from 40 to 90 weight-%, preferably in the range of from 45 to 89.5 weight-%, more preferably in the range of from 50 to 89 weight-%, based on the total weight of the liquid phase.

15. The cosmetic composition of embodiment 12 or 14, wherein the anhydrous phase comprises an oil being one or more of a mineral oil, an animal oil, a vegetal oil and a synthetic oil, preferably one or more of a vegetal oil, a mineral oil and a synthetic oil, more preferably one or more of a synthetic oil and a mineral oil, more preferably a synthetic oil.

16. The cosmetic composition of any one of embodiments 1 to 15, further comprising at least one additional cosmetically acceptable component other than the organic effect pigment; wherein said cosmetically acceptable component is preferably one or more of a surfactant, an oil other than the oil defined in embodiment 15, a cosmetically active ingredient, a preservative, a chelating agent, a neutralizing agent, a rheological agent, an excipient, an emulsifier, a fragrance, a thickener, a polymer, a gel former, a photoprotective agent, an antioxidant, an antifoams, a resin, a stabilizer, a sterilizing agent, a propellant, a drying agent, an humectant, an antioxidant and a plant extract;
wherein said cosmetically acceptable component more preferably is one or more of a surfactant, an oil other than the oil defined in embodiment 15, a cosmetically active ingredient, a preservative, a chelating agent, a neutralizing agent, a rheological agent, an excipient, an emulsifier, and a fragrance;
wherein said cosmetically acceptable component more preferably is one or more of a surfactant, an oil other than the oil defined in embodiment 15, a cosmetically active ingredient, a preservative, a chelating agent, a neutralizing agent, and a rheological agent.

17. The cosmetic composition according to any one of embodiments 9 to 15, further comprising at least one additional cosmetically acceptable component other than the organic effect pigment, wherein said at least one cosmetically acceptable component is dissolved in the liquid medium, the at least one cosmetically acceptable component forming the liquid phase with the liquid medium, wherein the at least one additional cosmetically acceptable component other than the organic effect pigment preferably is as defined in embodiment 16.

18. The cosmetic composition of any one of embodiments 1 to 17, being in the form of a cream, an emulsion, a foam, a gel, a lotion, a milk, a mousse, an ointment, a paste, a spray, or a suspension.

19. The cosmetic composition of any one of embodiments 1 to 18, wherein from 0 to 0.001 weight-%, preferably from 0 to 0.0001 weight-%, more preferably from 0 to 0.00001 weight-%, of the cosmetic composition consist of an effect pigment other than the organic effect pigment defined in any one of embodiments 1 to 7.

20. The cosmetic composition of any one of embodiments 1 to 19, wherein from 0 to 0.001 weight-%, preferably from 0 to 0.0001 weight-%, more preferably from 0 to 0.00001 weight-%, of the cosmetic composition consist of a polyelectrolyte.

21. The cosmetic composition of any one of embodiments 1 to 20, wherein the cellulose nanocrystal flakes are not coated with one or more inorganic oxides.

22. The cosmetic composition of any one of embodiments 1 to 21, wherein the cellulose nanocrystal flakes are obtained or obtainable by a process comprising (i) and (ii) as defined in any one of embodiments 23 to 52.

23. A process for preparing a cosmetic composition, preferably the composition according to any one of embodiments 1 to 22, the process comprising
(iii) providing an aqueous dispersion comprising water and cellulose nanocrystals;
(iv) subjecting the aqueous suspension provided according to (i) to drying conditions, obtaining a film; and fragmenting said film into flakes, obtaining an organic effect pigment;
(iii) preparing a mixture comprising the organic effect pigment obtained from (ii) and a liquid phase, and optionally at least one additional cosmetically acceptable component other than the organic effect pigment obtained from (ii), obtaining the cosmetic composition.

24. The process of embodiment 23, wherein in the aqueous dispersion provided according to (i), the cellulose nanocrystals are comprised in an amount in the range of from 0.05 to 10 weight-%, preferably in the range of from 0.1 to 8 weight-%, more preferably in the range of from 0.5 to 6 weight-%, more preferably in the range of from 0.75 to 5 weight-%, more preferably in the range of from 1 to 4 weight-%, based on the total weight of the aqueous dispersion.

25. The process of embodiment 23 or 24, wherein the cellulose nanocrystals in the aqueous dispersion provided according to (i) are sodium cellulose nanocrystals sulfate, wherein the sulfur content is of less than 1 weight %, preferably less than 0.9 weight-%, based on the weight of the cellulose nanocrystals.

26. The process of any one of embodiments 23 to 25, wherein the aqueous dispersion provided according to (i) is an acidic aqueous dispersion, wherein the aqueous phase of the dispersion has a pH in the range of from 0 to 5, preferably in the range of from 1 to 4, more preferably in the range of from 2 to 3, determined as described in Reference Example 1d.

27. The process of any one of embodiments 23 to 26, wherein the aqueous dispersion provided according to (i) additionally comprises an acid, wherein the acid preferably is one or more of a hydrochloric acid, a sulfonic acid, a nitric acid and a citric acid, more preferably one or more of a hydrochloric acid, a nitric acid and a citric acid, more preferably one or more of a hydrochloric acid and a citric acid, more preferably a hydrochloric acid.

28. The process of any one of embodiments 23 to 27, wherein the water comprised in the aqueous dispersion is deionized water.

29. The process of any one of embodiments 23 to 28, wherein the cellulose nanocrystals comprised in the aqueous suspension provided according to (i) have an average particle size in the range of from 1 to 50 micrometers, determined as described in Reference Example 1e.

30. The process of any one of embodiments 23 to 29, wherein the cellulose nanocrystals comprised in the aqueous suspension provided according to (i) are hydrolyzed cellulose nanocrystals.

31. The process of any one of embodiments 23 to 30, wherein the cellulose nanocrystals comprised in the aqueous suspension provided according to (i) exhibit a crystallite average particle diameter in the range of from 1 to 10 nm, preferably in the range of from 1.5 to 6 nm, more preferably in the range of from 2 to 5 nm, determined as described in Reference Example 1f.

32. The process of any one of embodiments 23 to 31, wherein the cellulose nanocrystals comprised in the aqueous suspension provided according to (i) exhibit a crystallite average particle length in the range of from 20 to 200 nm, preferably in the range of from 30 to 150 nm, more preferably in the range of from 40 to 110 nm, determined as described in Reference Example 1f.

33. The process of any one of embodiments 23 to 32, wherein the cellulose nanocrystals comprised in the aqueous suspension provided according to (i) exhibit a crystallinity in the range of from 70 to 100%, preferably in the range of from 85 to 100%, determined as described in Reference Example 1g.

34. The process of any one of embodiments 23 to 33, wherein the cellulose nanocrystals comprised in the aqueous suspension according to (i) have a BET specific surface area in the range of from 150 to 700 $m^2/g$, preferably in the range of from 200 to 600 $m^2/g$, more preferably in the range of from 300 to 500 $m^2/g$, determined as described in Reference Example 1h.

35. The process of any one of embodiments 23 to 34, wherein the cellulose nanocrystals comprised in the aqueous suspension provided according to (i) are obtainable or obtained by a method comprising
  (a) isolating cellulose from a natural source of cellulose, preferably from wood or cotton;
  (b) hydrolyzing with an acid, preferably sulfuric acid, the isolated cellulose obtained in (a), obtaining the cellulose nanocrystals.

36. The process of any one of embodiments 23 to 35, further comprising preparing the cellulose nanocrystals according to (i), said preparing comprising
  (a) isolating cellulose from a natural source of cellulose, preferably from wood or cotton;
  (b) hydrolyzing with an acid, more preferably sulfuric acid, the isolated cellulose obtained in (a), obtaining the cellulose nanocrystals.

37. The process of any one of embodiments 23 to 36, wherein the aqueous dispersion provided according to (i) additionally comprises a cosmetically acceptable dye, preferably a cosmetically acceptable water-soluble dye at a temperature in the range of from 10 to 50° C., preferably in the range of from 15 to 30° C.

38. The process of embodiment 37, wherein the cosmetically acceptable dye is selected from the group consisting of a blue dye, a black dye, a red dye, a green dye, a yellow dye, a violet dye, an orange dye and a brown dye.

39. The process of embodiment 37 or 38, wherein the cosmetically acceptable dye is present in the aqueous dispersion provided according to (i) in an amount in the range of from 0.0005 to 0.1 weight-%, preferably in the range of from 0.001 to 0.05 weight-%, more preferably in the range of from 0.001 to 0.01 weight-%, based on the weight of the aqueous dispersion provided according to (i).

40. The process of any one of embodiments 23 to 39, wherein the aqueous dispersion provided according to (i) additionally comprises a salt, wherein the salt is one or more of sodium chloride (NaCl), potassium chloride (KCl), sodium iodide (NaI), potassium iodide (KI), ammonium chloride ($NH_4Cl$), sodium sulfate ($Na_2SO_4$).

41. The process of embodiment 40, wherein in the aqueous dispersion provided according to (i), the mass ratio of salt relative to water, m(salt):m(water), is in the range of from 0.00001:1 to 0.1:1, preferably in the range of from 0.0001:1 to 0.01:1, more preferably in the range of from 0.0001:1 to 0.001:1.

42. The process of any one of embodiments 23 to 41, comprising preparing the aqueous dispersion and subjecting the dispersion, prior to (ii), to sonication.

43. The process of any one of embodiments 23 to 42, wherein from 99 to 100 weight-%, preferably from 99.5 to 100 weight-%, more preferably from 99.9 to 100 weight-% of the aqueous dispersion provided according to (i) consist of water, the cellulose nanocrystals, preferably the hydrolyzed cellulose nanocrystals, preferably an acid as defined in embodiment 27, and optionally one or more of a cosmetically acceptable absorption dye as defined in any one of embodiments 37 to 39 and a salt as defined in embodiment 40 or 41.

44. The process of any one of embodiments 23 to 43, wherein from 0 to 0.01 weight-%, preferably from 0 to 0.001 weight-%, more preferably from 0 to 0.0001 weight-%, of the aqueous dispersion provided according to (i) consist of a polyelectrolyte.

45. The process of any one of embodiments 23 to 44, wherein subjecting the aqueous suspension provided according to (i) to drying conditions according to (ii) comprises
  pouring the aqueous dispersion provided according to (i), into a container;
  drying the aqueous dispersion into the container, obtaining a film.

46. The process of embodiment 45, wherein drying the aqueous dispersion is performed in a gas atmosphere having a temperature in the range of from 15 to 30° C., preferably in the range of from 18 to 25° C., more preferably for a duration in the range of from 10 to 30 hours, wherein the gas atmosphere preferably comprises one or more of oxygen and nitrogen, wherein the gas atmosphere more preferably comprises nitrogen or more preferably is air.

47. The process of embodiment 45, wherein drying the aqueous dispersion is performed in a gas atmosphere having a temperature in the range of from 40 to 90° C., preferably in the range of from 65 to 85° C., more preferably for a duration in the range of from 2 to 8 hours, more preferably in the range of from 3 to 7 hours, wherein the gas atmosphere preferably comprises oxygen, wherein the gas atmosphere preferably comprises one or more of oxygen and nitrogen, wherein the gas atmosphere more preferably comprises nitrogen or more preferably is air.

48. The process of any one of embodiments 23 to 47, wherein the film obtained in (ii) is an iridescent film.

49. The process of any one of embodiments 23 to 48, wherein the film has an average thickness in the range of from 30 to 200 micrometers, preferably in the range of from 50 to 100 micrometers, determined as described in Reference Example 1c.

50. The process of any one of embodiments 23 to 49, wherein the film has a water content in the range of from 0.1 to 5 weight-%, preferably in the range of from 0.1 to 1 weight-%, based on the total weight of the film.

51. The process of any one of embodiments 23 to 50, wherein fragmenting said film into flakes according to (ii) is performed until the average size of the flakes is in the range of from 10 to 6500 micrometers, preferably in the range of from 50 to 2000 micrometers, more preferably in the range of from 200 to 1000 micrometers, more preferably in the range of from 400 to 800 micrometers, determined as defined in Reference Example 1a.

52. The process of any one of embodiments 23 to 51, wherein after fragmenting said film into flakes according to (ii), (ii) further comprises screening the obtained flakes.

53. The process of any one of embodiments 23 to 52, wherein the organic effect pigment comprised in the mixture prepared according to (iii) is present in amount in the range of from 0.025 to 99 weight-%, preferably in the range of from 0.04 to 80 weight-%, more preferably in the range of from 0.05 to 30 weight-%, more preferably in the range of from 0.10 to 20 weight-%, more preferably in the range of from 0.5 to 15 weight-%, more preferably in the range of from 1 to 10 weight-%, more preferably in the range of from 2 to 8 weight-%, more preferably in the range of from 3 to 7 weight-%, based on the total weight of the mixture.

54. The process of any one of embodiments 23 to 53, wherein the liquid phase in the mixture prepared according to (iii) contains a cosmetically acceptable liquid medium.

55. The process of any one of embodiments 23 to 54, wherein the liquid phase in the mixture prepared according to (iii) has a dielectric constant in the range of from 1 to 100, preferably in the range of from 2 to 80, preferably determined as described in Reference Example 1i.

56. The process of any one of embodiments 23 to 55, wherein the liquid phase in the mixture prepared in (iii) is an aqueous phase or an anhydrous phase.

57. The process of embodiment 56, wherein the aqueous phase comprises water in amount in the range of from 50 to 99 weight-%, preferably in the range of from 60 to 99 weight-%, based on the total weight of the liquid phase.

58. The process of embodiment 56 or 57, wherein the aqueous phase has a pH in the range of from 4 to 10, preferably in the range of from 6 to 8, determined as described in Reference Example 1d.

59. The process of embodiment 58, wherein the anhydrous phase comprises an oil in amount in the range of from 40 to 90 weight-%, preferably in the range of from 59 to 80 weight-%, based on the total weight of the liquid phase.

60. The process of embodiment 56 or 59, wherein the anhydrous phase comprises an oil being one or more of a mineral oil, an animal oil, a vegetal oil and a synthetic oil, preferably one or more of a mineral oil, a vegetal oil and a synthetic oil, more preferably a synthetic oil.

61. The process of any one of embodiments 23 to 60, wherein the mixture prepared in (iii) further comprises at least one additional cosmetically acceptable component other than the organic effect pigment.

62. The process of embodiment 61, wherein said cosmetically acceptable component is one or more of a surfactant, an oil other than the oil defined in embodiment 60, a cosmetically active ingredient, a preservative, a chelating agent, a neutralizing agent, a rheological agent, an excipient, an emulsifier, a fragrance, a thickener, a polymer, a gel former, a photoprotective agent, an antioxidant, an antifoams, a resin, a stabilizer, a sterilizing agent, a propellant, a drying agent, an humectant, an antioxidant and a plant extract;
   wherein said cosmetically acceptable component preferably is one or more of a surfactant, an oil other than the oil defined in embodiment 60, a cosmetically active ingredient, a preservative, a chelating agent, a neutralizing agent, a rheological agent, an excipient, an emulsifier, and a fragrance;
   wherein said cosmetically acceptable component more preferably is one or more of a surfactant, an oil other than the oil defined in embodiment 60, a cosmetically active ingredient, a preservative, a chelating agent, a neutralizing agent, and a rheological agent.

63. The process of embodiment 60, wherein the mixture prepared in (iii) further comprises at least one additional cosmetically acceptable component other than the organic effect pigment, wherein said component is dissolved in the liquid medium, said at least one additional cosmetically acceptable component forming the liquid phase with the cosmetically acceptable liquid medium;
   wherein the at least one additional cosmetically acceptable component other than the organic effect pigment preferably is the at least one additional cosmetically acceptable component as defined in embodiment 62 and wherein the liquid phase preferably is as defined in any one of embodiments 56 to 60.

64. The process of any one of embodiments 23 to 63, wherein preparing a mixture comprising the organic effect pigment obtained from (ii), and the liquid phase, according to (iii) comprises
   mixing the organic effect pigment and the liquid phase at a temperature in the range of from 15 to 30° C., preferably in the range of from 18 to 25° C.

65. The process of any one of embodiments 23 to 64, consisting of (i), (ii) and (iii).

66. A method for preparing two or more cosmetic compositions, said cosmetic compositions comprising the same organic effect pigment, which comprises cellulose nanocrystal flakes, as coloring agent and having different flake colors in the visible range, the method comprising
   adjusting the dielectric constant of the liquid phase of said cosmetic compositions, wherein the organic effect pigment is preferably obtainable or obtained by a process comprising (i) and (ii) as defined in any one of embodiments 23 to 52.

67. The method of embodiment 66, wherein each of the cosmetic compositions is in the form of a cream, an emulsion, a foam, a gel, a lotion, a milk, a mousse, an ointment, a paste, a spray or a suspension.

68. Use of an organic effect pigment, comprising cellulose nanocrystal flakes, as coloring agent for preparing two or more cosmetic compositions, preferably cosmetic compositions in the form of a cream, an emulsion, a foam, a gel, a lotion, a milk, a mousse, an ointment, a paste, a spray or a suspension, said two or more compositions having different flake colors in the visible range, wherein the organic effect pigment is obtainable or obtained by a process comprising (i) and (ii) as defined in any one of embodiments 23 to 52.

69. The use of embodiment 68, wherein the liquid phases of the two or more cosmetic compositions exhibit different dielectric constants, determined as described in Reference Example 1i.

70. The use of embodiment 68 or 69, wherein a first cosmetic composition has cellulose nanocrystal flakes having a green absorption color with blue iridescence and a second cosmetic composition has cellulose nanocrystal flakes having blue, red, pink, black or grey absorption color with blue iridescence.

71. Use of a cosmetic composition according to any one of embodiments 1 to 22 as a lip balm, an eyeshadow, a nail polish, a mascara, an eyeliner or a lipstick.

72. A kit for preparing two cosmetic compositions having different flake colors in the visible range, comprising:
   (1) one organic effect pigment, wherein the organic effect pigment comprises cellulose nanocrystal flakes, wherein the cellulose nanocrystal flakes have an average size in the range of from 10 to 6500 micrometers determined as defined in Reference Example 1a, wherein the organic effect pigment is preferably as defined in any one of embodiments 1 to 7;
(2) a first cosmetic composition; and
(3) a second cosmetic composition other than the first cosmetic composition.

73. The kit of embodiment 72, wherein the first cosmetic composition comprises a first liquid phase and the second cosmetic composition comprises a second liquid phase, wherein the first liquid phase and the second liquid phase exhibit different dielectric constants, determined as described in Reference Example 1i.

In the context of the present invention, it has been realized by the inventors that dielectric constant or polarity (determined through dielectric constant) of a cosmetic composition or of a cosmetic base has an effect on the absorption color of an organic effect pigment, namely the cellulose nanocrystal flakes. Indeed, by increasing or lowering the dielectric constant, it was possible to vary the absorption color of flakes (glitters) in a cosmetic composition while using the same starting organic effect pigment, namely cellulose nanocrystal flakes. This is illustrated by the different examples of the present invention.

In the context of the present invention, "a cosmetically acceptable liquid medium" is a liquid medium that is compatible with the skin and/or its integuments. It is preferably a liquid medium which has a pleasant color, odor and/or feel and which does not cause any unacceptable discomfort (stinging, tautness or redness) liable to discourage the consumer from using the cosmetic composition comprising it.

Further, in the context of the present invention, the term "liquid" in "liquid medium" or "liquid phase" means that at a temperature of the cosmetic composition in the range of from 5 to 70° C., preferably in the range of from 10 to 60° C., more preferably in the range of from 15 to 50° C., the given medium or phase is liquid.

Further, in the context of the present invention, the term "at least one cosmetically acceptable component is dissolved" in a liquid medium means that at a temperature of the cosmetic composition in the range of from 5 to 70° C., preferably in the range of from 10 to 60° C., more preferably in the range of from 15 to 50° C., the said at least one cosmetically acceptable component is dissolved.

Further, in the context of the present invention, a term "X is one or more of A, B and C", wherein X is a given feature and each of A, B and C stands for specific realization of said feature, is to be understood as disclosing that X is either A, or B, or C, or A and B, or A and C, or B and C, or A and B and C. In this regard, it is noted that the skilled person is capable of transfer to above abstract term to a concrete example, e.g. where X is a chemical element and A, B and C are concrete elements such as Li, Na, and K, or X is a temperature and A, B and C are concrete temperatures such as 10° C., 20° C., and 30° C. In this regard, it is further noted that the skilled person is capable of extending the above term to less specific realizations of said feature, e.g. "X is one or more of A and B" disclosing that X is either A, or B, or A and B, or to more specific realizations of said feature, e.g. "X is one or more of A, B, C and D", disclosing that X is either A, or B, or C, or D, or A and B, or A and C, or A and D, or B and C, or B and D, or C and D, or A and B and C, or A and B and D, or B and C and D, or A and B and C and D.

Furthermore, in the context of the present invention, the term "consists of" with regard to the weight-% of one or more components indicates the weight-% amount of said component(s) based on 100 weight-% of the entity in question. For example, the wording "wherein from 0 to 0.001 weight-% of the cosmetic composition consists of an effect pigment other than the organic effect pigment defined in any one of embodiments 1 to 7" indicates that among the 100 weight % of the components of which said cosmetic composition consists of, 0 to 0.001 weight-% is an effect pigment other than the organic effect pigment defined in any one of embodiments 1 to 7. In other word, it has to be understood in the sense that, for example, the cosmetic composition is substantially free of an effect pigment other than the organic effect pigment defined in any one of embodiments 1 to 7, preferably free of an effect pigment other than the organic effect pigment defined in any one of embodiments 1 to 7.

The present invention is further illustrated by the following Reference Examples, Comparative Examples and Examples.

EXAMPLES

Reference Example 1 Determination Methods a. Determination of the average flakes size: Flakes were pressed onto a transparent microscope slide and viewed through a Zeiss Axio Lab.A1 optical microscope. Particle sizes were measured from microscope images using the Zeiss Zen software.

b. Determination of the average surface area of the flakes: Flakes were pressed onto a transparent microscope slide and viewed through a Zeiss Axio Lab.A1 optical microscope. Average surface areas were measured from microscope images using the Zeiss Zen software.

c. Determination of the average thickness of the flakes/film: Thickness was measured in the film state, prior to blending to flakes. Film thickness was measured with a micrometer, measuring the film thickness at 3 locations of the film and taking an average.

d. Determination of the pH: pH of pre-cast CNC solutions and formulations with CNC flakes were measured with a Mettler Toledo InLab Routine pH probe with a Mettler Toldeo SevenCompact base unit. The pH probe was calibrated to pH buffer solutions at pH 4, 7, and 10.

e. Determination of the average particle size of cellulose nanocrystals (CNC): Particle size was determined by photon correlation spectroscopy (Zetasizer 3000, Malvern Instruments, Worcestershire, U.K.). Photon correlation spectroscopy (PCS) is a light scattering method; the measured CNC particle size values are the hydrodynamic radii of equivalent spheres and do not represent actual physical dimensions of the rodlike NCC particles. However, they are valid for comparison purposes. Measurements were performed on samples containing 10 mM NaCl and a final CNC concentration of 1.0-1.5 wt %. Samples were filtered with 0.45 μm nylon Whatman syringe filters to remove dust or other large particles.

f. Determination of the crystallite average particle diameter/length: It was measured by the National Research Council of Canada by AFM.

g. Determination of the crystallinity: It was measured by the National Research Council of Canada by XRD.

h. Determination of the BET specific surface area: The BET specific surface area was determined according to DIN 66131 or DIN-ISO 9277 using liquid nitrogen.

i. Determination of the dielectric constant: it was determined by using a Dielectric Constant Meter. Further, it is noted that dielectric constants of water and other liquids as well as method for measuring it are well-known in the art.

Example 1 Preparation of Cellulose Nanocrystal Iridescent Flakes (Organic Effect Pigment)

For Example 1.1, an aqueous dispersion comprising cellulose nanocrystals from CelluForce NCV100 (CAS No. 9005-22-5, molecular formula $[(C_6O_5H_{10})_{22-28} SO_3Na]_{4-6}$, a BET specific surface area of 400 m$^2$/g, a crystallite average particle diameter of 2.3-4.5 nm, a crystallite average particle length of 44-108 nm, a sulfur content of 0.86-0.89%, pH dispersed in water 6-7) was prepared with deionized water, cellulose nanocrystals and hydrochloric acid. The amount of cellulose nanocrystals in the dispersion was of 2-3 weight-% based on the weight of the dispersion and the pH of the aqueous phase of the dispersion was of 2-3. The aqueous dispersion was poured to about 1-2 cm deep into a large, shallow, polystyrene tray.

For Examples 1.2-1.4, to the dispersion of cellulose nanocrystals was added different aqueous dyes (see Table 1 below for the type and amount of dyes). The pH of the obtained dispersion was of 2.7. The obtained dispersion was poured to about 1-2 cm deep into a large, shallow, polystyrene tray.

The dispersion was either left within a fume hood to dry to a film overnight, or placed into a 75° C. oven for about 5 hours to dry to a film. Iridescent films are obtained (see FIG. 1).

The obtained films were peeled off the tray and put into a kitchen blinder and blended for 1-2 minutes to obtain flakes with a size in the range of 10 to 1000 micrometers and with different colors (see Table 1 below).

C. Geismar base (aqueous surfactant media)

| Phase | Ingredient | INCI name | % w/w | Function |
|---|---|---|---|---|
| A | DI Water | Water (aqua) | 64.67 | Solvent |
|   | EDTA BD | Disodium EDTA | 0.10 | Chelating agent |
|   | Standapol ES-2K | Sodium Laureth Sulfate (SLES) | 27.50 | Anionic surfactant |
|   | Dehyton PK 45 | Cocamidopropyl Betaine | 1.00 | Amphoteric surfactant |
|   | D-Panthenol 75 W | Panthenol | 0.03 | Active ingredient |
|   | Kathon CG | Methylchloro-isothiazolinone (and) Methyl-isothiazolinone | 0.10 | Preservative |
| B | Rheocare TTA | Acrylates Copolymer | 6.00 | Rheological additive |
|   | Amp 95 | Aminomethyl-propanol | 0.60 | Neutralizer additive |

Dielectric constant: about 40-60 & pH: 7

The CNC flakes obtained in Example 1 were put into the different cosmetic bases A, B and C according to Table 2 below. The flakes were hand mixed into the cosmetic bases at room temperature.

TABLE 1

Cellulose nanocrystal flakes (organic effect pigments)

|  | CNC dispersion (in mL) | Dyes (in µL) | Dyes name (FDA names) | CNC flakes size (micrometers) | CNC flakes color |
|---|---|---|---|---|---|
| Ex. 1.1 | 50 | 0 | — | 10-1000 | Iridescent blue |
| Ex. 1.2 | 50 | 50 | D&C Black #2 (1% solution) | 10-1000 | Black absorption color with blue iridescence |
| Ex. 1.3 | 50 | 50 | FD&C Blue #1 (1% solution) | 10-1000 | Blue/green absorption color with blue iridescence |
| Ex. 1.4 | 50 | 50 | D&C Red #33 (1% solution) | 10-1000 | Red absorption color with blue iridescence |

Example 2 Preparation of Cosmetic Compositions

A. Anhydrous base (Versagel M750)
Mineral oil (>90 weight-%) and the remaining part (<10 weight-%) is Ethylene/Propylene/Styrene Copolymer (and) Butylene/Ethylene/Styrene Copolymer.
Dielectric constant: about 2

B. Aqueous base (cosmetic preservative) used for a water color eye-shadow

| Ingredient | INCI Name | % w/w | Function |
|---|---|---|---|
| DI Water | Water (aqua) | 98 | Solvent |
| Xanthan gum | Xanthan gum | 1 | Surfactant |
| Euxyl PE 9010 | Phenoxyethanol (and) Ethylhexylglycerin | 1 | Preservative |

Dielectric constant: about 80 & pH: 7

TABLE 2

Cosmetic compositions

| Composition | CNC flakes (color) | CNC flakes concentration in the composition (wt-%) | Base | CNC flakes color in composition |
|---|---|---|---|---|
| 2.1 | Ex. 1.1 (blue) | 5 | A | Iridescent blue |
| 2.2 | Ex. 1.1 (blue) | 5 | B | Iridescent red |
| 2.3 | Ex. 1.1 (blue) | 5 | C | Iridescent green |
| 2.4 | Ex. 1.2 (black) | 5 | A | Iridescent blue, black absorption |
| 2.5 | Ex. 1.3 (red) | 5 | A | Iridescent blue, red absorption |

TABLE 2-continued

| | | Cosmetic compositions | | |
|---|---|---|---|---|
| Composition | CNC flakes (color) | CNC flakes concentration in the composition (wt-%) | Base | CNC flakes color in composition |
| 2.6 | Ex. 1.4 (blue/green) | 5 | A | Iridescent blue, blue/green absorption |

As may be taken from Table 2, for the compositions 2.1, 2.2, and 2.3, the CNC effect pigments offer unique color properties such as color variability based on the composition of the base wherein they are suspended, namely a single product can provide an array of different flake colors depending on how it is formulated, and a holographic effect. Compositions 2.4, 2.5, and 2.6 demonstrate how dyes and pigments can add additional absorption color alongside the iridescent color.

FIGS. 2 to 4 are pictures and microscope images of the CNC flakes in the cosmetic compositions 2.1 to 2.3 and FIG. 5 is a picture of the CNC flakes in the cosmetic compositions 2.4 to 2.6.

Comparative Example 1 Preparation of Cosmetic Compositions

Pigment 1:
Chione™ Celestial Gold S232L (powder)—INCI Name: Synthetic Fluorphlogopite (and) Titanium Dioxide (and) Iron Oxides
Pigment 2:
Cloisonné® Super Blue 636Z (powder)—INCI Name: Mica (and) Titanium Dioxide (and) Ferric Ferrocyanide
Pigment 3:
Reflecks™ Dimensions Brilliant Blue GB80D (flakes)—INCI Name: Calcium Sodium Borosilicate (and) Titanium Dioxide (and) Silica Each inorganic pigment as listed above was put into the different bases A, B and C as in Example 1. The pigments were hand mixed into the cosmetic bases at room temperature.

TABLE 3

| | | Cosmetic compositions | | |
|---|---|---|---|---|
| Composition | Pigment (color) | Pigment concentration in composition (wt-%) | Base | Pigment color in composition |
| C.1 | 1 (metallic gold) | 1 | A | Metallic gold |
| C.2 | 2 (metallic blue) | 1 | A | Metallic blue |
| C.3 | 3 (pearlescent white flakes) | 1 | A | Pearlescent white (flakes) |
| C.4 | 1 (metallic gold powder) | 1 | B | Metallic gold |
| C.5 | 2 (metallic blue) | 1 | B | Metallic blue |
| C.6 | 3 (pearlescent white) | 1 | B | Pearlescent white (flakes) |
| C.7 | 1 (metallic gold powder) | 1 | C | Metallic gold |
| C.8 | 2 (metallic blue) | 1 | C | Metallic blue |
| C.9 | 3 (pearlescent white flakes) | 1 | C | Pearlescent white (flakes) |

As may be taken from Table 3, for a given pigment not according to the present invention, the final color of the obtained cosmetic compositions, or the final color of the flakes in the obtained cosmetic compositions, is always the same even if the pigments were introduced in different cosmetic bases presenting different properties, such as polarity. This is illustrated by FIGS. 6 to 8. These results demonstrate that using the inventive organic effect pigment which offers unique color properties depending on the composition of the cosmetic base.

CITED LITERATURE

Figure 1:
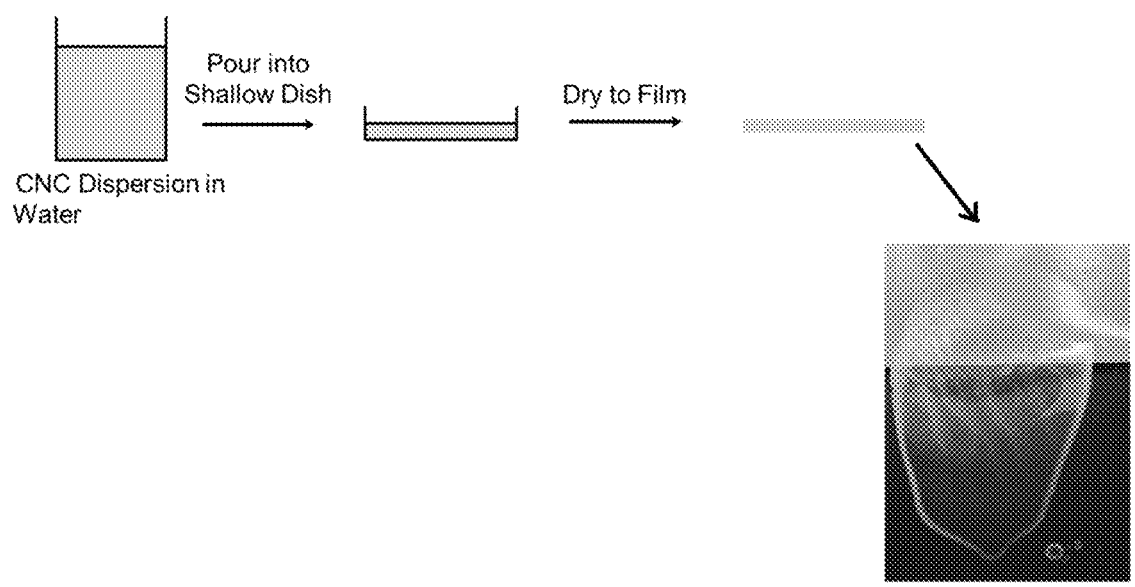
FIG. 1 is a scheme illustrating the step for producing iridescent films.
Figure 2:
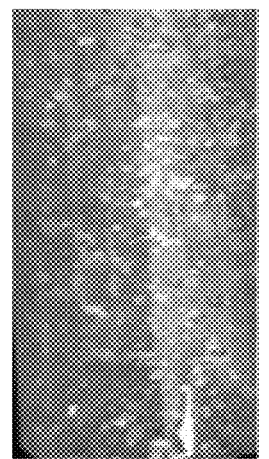
FIG. 2a is a picture of the CNC flakes in the cosmetic composition 2.1.
FIG. 2b is a microscope image of the CNC flakes in the cosmetic composition 2.1 (magnification: 5×, 200 um scale bar).
Figure 2:
Figure 3:
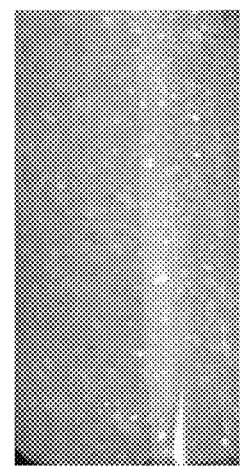
FIG. 3a is a picture of the CNC flakes in the cosmetic composition 2.2.
FIG. 3b is a microscope image of the CNC flakes in the cosmetic composition 2.2 (magnification: 5×, 200 um scale bar).
Figure 3:
Figure 4:
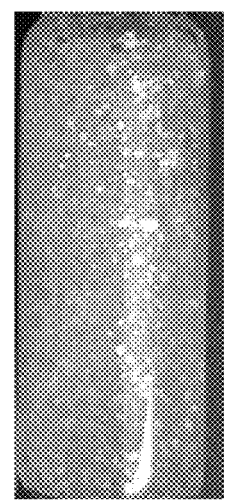
FIG. 4a is a picture of the CNC flakes in the cosmetic composition 2.3.
FIG. 4b is a microscope image of the CNC flakes in the cosmetic composition 2.3 (magnification: 5×, 200 um scale bar).
Figure 4:
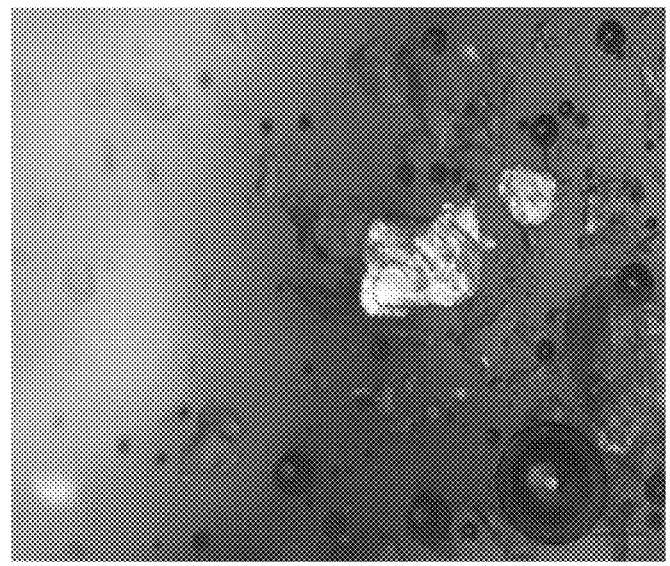
Figure 5:
FIG. 5 is a picture of the CNC flakes in the cosmetic compositions 2.4, 2.5 and 2.6.
Figure 6:
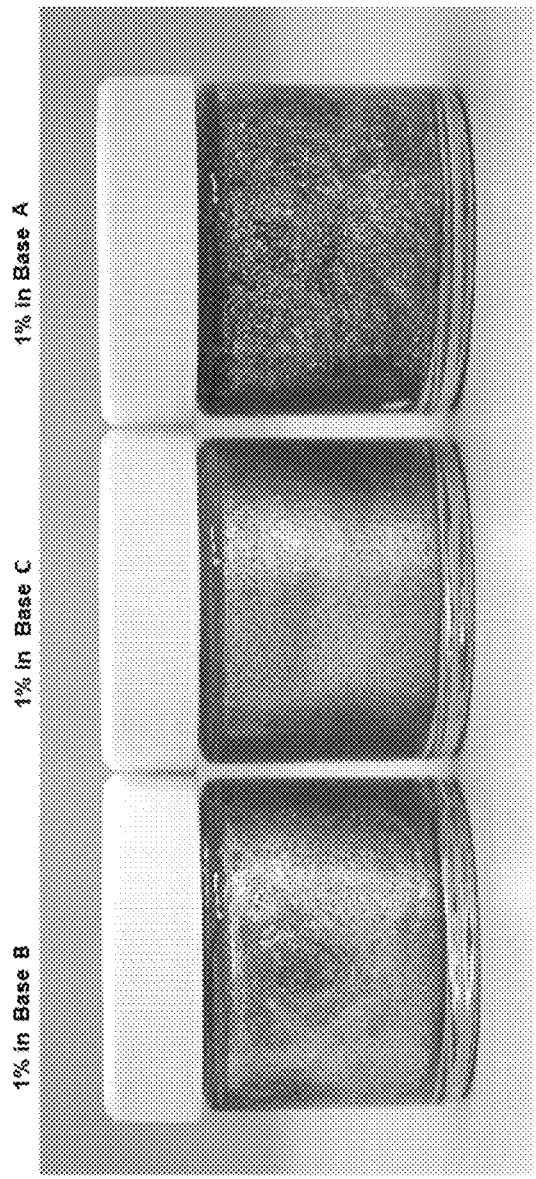
FIG. 6 is a picture of the pigment 1 in the cosmetic composition C.1, C.4 and C.7.
Figure 7:
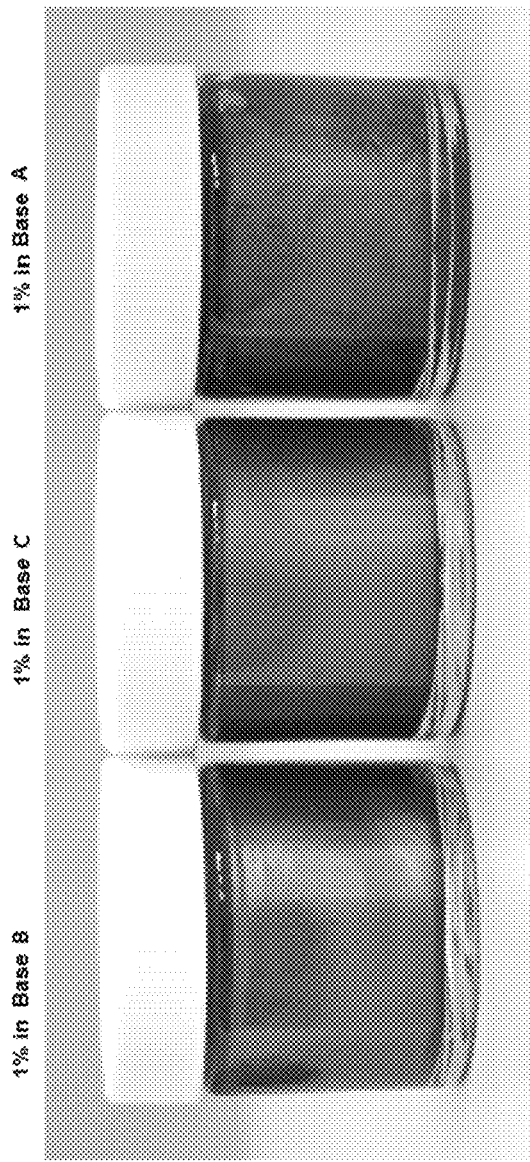
FIG. 7 is a picture of the pigment 2 in the cosmetic composition C.2, C.5 and C.8.
Figure 8:
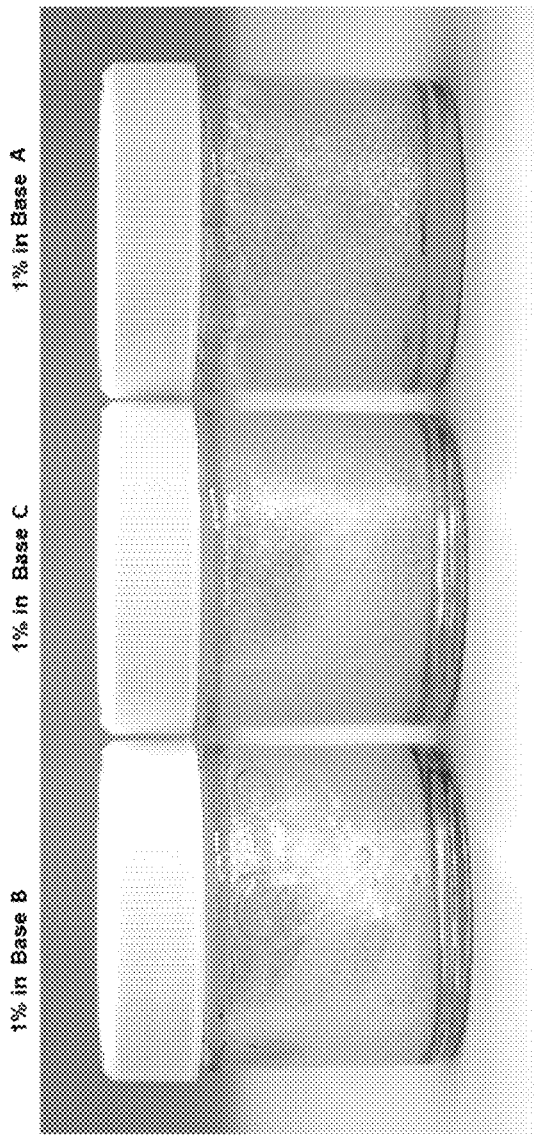
FIG. 8 is a picture of the pigment 3 in the cosmetic composition C.3, C.6 and C.9.

WO 2018/100065 A1
JP 2017-048181 A
US2019/0002700 A1
WO 2012/112541 A2

The invention claimed is:
1. A cosmetic composition comprising an organic effect pigment, wherein the organic effect pigment comprises cellulose nanocrystal flakes, wherein the cellulose nanocrystal flakes have an average size in the range of from 10 to 6500 micrometers;
   wherein the organic effect pigment is obtained as follows:
   (i) providing an aqueous dispersion comprising water and cellulose nanocrystals; and
   (ii) subjecting the aqueous dispersion provided according to (i) to drying conditions, obtaining a film; and said film is fragmented into flakes, obtaining an organic effect pigment;
   wherein in the aqueous dispersion provided according to (i), the cellulose nanocrystals are comprised in an amount in the range of from 0.05 to 10 weight-%, based on the total weight of the aqueous dispersion;
   wherein the cellulose nanocrystals comprised in the aqueous dispersion provided according to (i) exhibit a crystallite average particle diameter in the range of from 1 to 10 nm; and wherein the cellulose nanocrystals comprised in the aqueous dispersion provided according to (i) exhibit a crystallite average particle length in the range of from 20 to 200 nm.

2. The cosmetic composition of claim 1 comprising the organic effect pigment in an amount in the range of from 0.025 to 99 weight-%, based on the total weight of the cosmetic composition.

3. The cosmetic composition of claim 1, further comprising a liquid phase, wherein the cellulose nanocrystal flakes form a mixture with said liquid phase.

4. The cosmetic composition of claim 3, wherein at a temperature of the composition in the range of from 5 to 70° C., from 99 to 100 weight-% of the cellulose nanocrystal flakes are dispersed in the cosmetically acceptable liquid medium.

5. The cosmetic composition of claim 3, wherein in the cosmetic composition, the color of the cellulose nanocrystal flakes in the visible spectrum depends on the dielectric constant of the liquid phase.

6. The cosmetic composition of claim 3, wherein the liquid phase is an aqueous phase or an anhydrous phase.

7. The cosmetic composition of claim 1, further comprising at least one additional cosmetically acceptable component other than the organic effect pigment.

8. The cosmetic composition of claim 3, wherein the liquid phase contains a cosmetically acceptable liquid medium.

* * * * *